United States Patent
Rouvellou et al.

(10) Patent No.: US 6,501,806 B1
(45) Date of Patent: Dec. 31, 2002

(54) ESTIMATION OF INTRODUCED FREQUENCY OFFSET BY A SIGNAL CORRECTION AND TRANSMISSION MEDIUM

(75) Inventors: Laurent Rouvellou, Paris (FR); Antoine Chouly, Paris (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/387,624

(22) Filed: Aug. 31, 1999

(30) Foreign Application Priority Data

Sep. 1, 1998 (FR) .............................. 98 10915

(51) Int. Cl.$^7$ ............................................... H04B 15/00
(52) U.S. Cl. ...................................... 375/285; 375/346
(58) Field of Search .................... 375/224, 227, 375/228, 229, 254, 256, 259, 285, 295, 296, 316, 340, 346, 348, 350, 222; 455/67.1, 67.3, 67.4

(56) References Cited

U.S. PATENT DOCUMENTS

| | | | |
|---|---|---|---|
| 4,847,872 A | 7/1989 | Hespelt et al. ................ 375/97 |
| 5,206,886 A | 4/1993 | Bingham ...................... 375/97 |
| 6,331,996 B1 | * 12/2001 | Lin et al. ..................... 375/130 |

FOREIGN PATENT DOCUMENTS

EP 0788225 A1 8/1997 ............. H03J/7/04

\* cited by examiner

Primary Examiner—Jean Corrielus

(57) ABSTRACT

The invention enables to estimate the frequency offset introduced by a transmission medium based on the transmission of a known sinusoidal-frequency signal. Two samples out of phase by $\Pi/2+p.2\Pi$ where p is an integer are multiplied to obtain a trigonometric function of said frequency offset. The estimate thus obtained is advantageously applied for correcting test signals received during a learning period preceding a transmission period between a transmitter and receiver. The estimate is also applicable for initializing adaptive algorithms for recovering the timing or echo cancellation at the level of the receiver. Any transmission system that utilizes one or various carriers and enables to transmit a sinusoidal signal at a given instant, notably Recommendation V34 of the CCITT.

7 Claims, 3 Drawing Sheets

ESTIMATION OF INTRODUCED FREQUENCY OFFSET BY A SIGNAL CORRECTION AND TRANSMISSION MEDIUM

FIELD OF THE INVENTION

The invention relates to a transmission system between at least a transmitter and at least a receiver via a transmission medium, likely to cause a frequency offset and an attenuation, said emitter comprising emitting means for emitting a sinusoidal signal of known frequency, and said receiver comprising receiving means for receiving said sinusoidal signal and estimation means for estimating said frequency offset from said received sinusoidal signal. The invention likewise relates to a receiver intended to be used in such a system, more particularly, a modem.

The invention also relates to a method of estimating the frequency offset caused on a carrier by a transmission medium, comprising a transmission step of a sinusoidal signal of known frequency. The invention also relates to a computer program implementing said frequency offset estimating method. The invention finally relates to a method of testing a transmission medium likely to cause a frequency offset, said method comprising steps of transmitting known test signals, receiving said test signal, and analyzing received test signals to derive properties of said medium therefrom.

The invention is applied to all the transmission systems that utilize one or various carriers and enable to transmit a sinusoidal signal at least at a given instant. The invention more particularly applies to modems, notably in accordance with Recommendation V34 of the CCITT.

BACKGROUND OF THE INVENTION

U.S. Pat. No. 5,206,886 describes a multicarrier transmission system that includes estimation means for estimating the frequency offset introduced by the transmission medium. The estimate obtained is used at the beginning of the data transmission phase to initialize the adaptive algorithms for recovering the carrier of the receiver. The proposed estimation method is a complex adaptive method based on the transmission of two sinusoidal signals having known frequencies f1 and f2. Upon reception, these signals are separated by filtering and the phases $\phi 1(t)$ and $\phi 2(t)$ are calculated as a function of time (this calculation causes a calculation of the arctangent to be performed for each signal and each considered instant). The functions are then analyzed to obtain said estimate.

SUMMARY OF THE INVENTION

The invention notably has for its object to propose another, simpler method of estimating the frequency offset caused by the transmission medium.

This object is achieved with the transmission system as defined in the opening paragraph and characterized in that said estimation means comprise sampling means for sampling said received sinusoidal signal, phase shifting means for producing $\Pi/2+p.2\Pi$ phase shifted samples of said received sinusoidal signal, where p is an integer, first calculation means for calculating said attenuation from at least two of said phase shifted samples, and second calculation means for calculating said frequency offset from at least two of said phase shifted samples and from the calculated attenuation.

The proposed method is particularly simple and thus cost-effective in terms of processing power. In an embodiment which is particularly easy to implement, first calculation means comprise means for calculating a mean value of an addition of the square value of two $\Pi/2$ phase shifted samples.

When the receiver comprises a reception filter, second calculation means use two $\Pi/2+p.2\Pi$ phase shifted samples where p is chosen so that said two samples are decorrelated. In an advantageous embodiment, the second calculation means comprise means for calculating a mean value of a product of said samples so as to provide a trigonometric function of said offset. When the received signal is not filtered, it is advantageous to chose p=0, because in this case, the invention implies only a single calculation of a trigonometric function.

The invention likewise proposes another use of an estimate of said frequency offset. Indeed, according to the invention, a system as described in the opening paragraph, which comprises test means for testing said transmission medium notably by transmitting, receiving and then analyzing known test signals so as to derive therefrom properties of said medium, also includes correction means for correcting said offset during the reception of at least certain of said test signals.

It is thus possible to reduce the effect of the frequency offset on the modeling of the transmission medium, more particularly on the evaluation of the signal-to-noise ratio. This evaluation of the signal-to-noise ratio is notably used for choosing at the transmitter end a transmission rate on the transmission medium. The invention particularly enables to avoid that the frequency offset introduced by the medium is interpreted as noise, that is, that the signal-to-noise ratio is overrated and thus that the transmission rate is underrated.

BRIEF DESCRIPTION OF THE DRAWINGS

These and other aspects of the invention are apparent from and will be elucidated, by non-limitative example, with reference to the embodiment(s) described hereinafter.

In the drawings.

DESCRIPTION OF PREFERRED EMBODIMENTS

Figure 1:
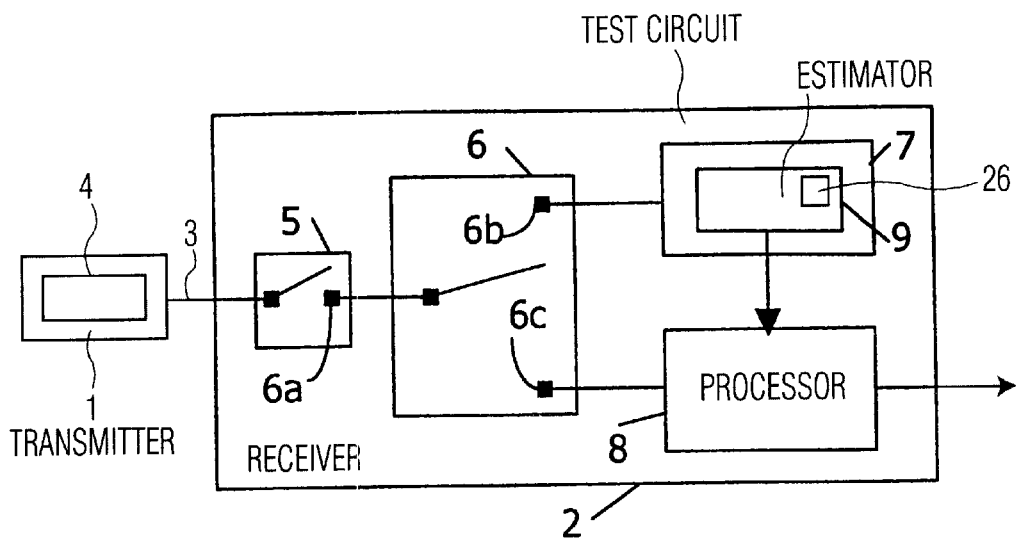
FIG. 1 represents a first example of a transmission system according to the invention.

In FIG. 1 is shown a first example of a transmission system according to the invention. This system comprises a transmitter 1 and a receiver 2 communicating between them via a transmission medium 3. By way of example this transmission medium may be a radio link, a telephone line. . . .

Setting up a connection between a transmitter 1 and a receiver 2 comprises a training phase followed by a data transmission phase. The transmitter 1 comprises means 4 for transmitting at least one sinusoid s(t) of known frequency $f_0$ during the training phase. The receiver 2 comprises means 5 for sampling received signals. It has two separate modes of operation, on the one hand, for the training phase and, on the other hand, for the data transmission phase. This is symbolized in FIG. 1 by a switching circuit 6 that connects the output 6a of the sampling means 5 to the input 6b of a test circuit 7 in the training phase and, in the data transmission phase, to the input 6c of a processing circuit 8 of the standard signal, which circuit produces output data. The test circuit 7 notably comprises means 9 for estimating the frequency offset $\Delta f$ that the transmission medium causes in the sinusoid s(t). The estimate $\Delta f$ obtained is transmitted to the means 8 for processing the signal, for example, for initializing standard adaptive algorithms such as timing recovery and/or echo canceler algorithms.

Figure 2:
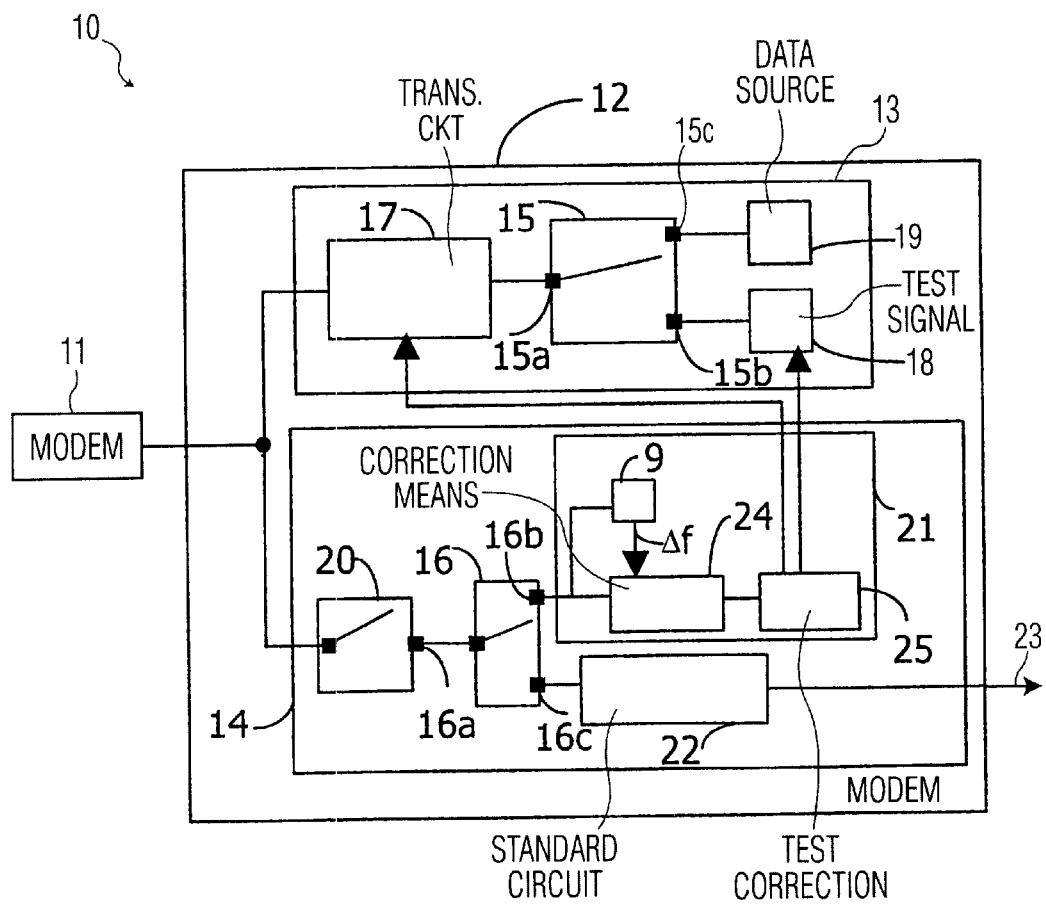
FIG. 2 represents a second example of a transmission system according to the invention.

In FIG. 2 is represented a second example of a transmission system according to the invention. This system 10 comprises two identical modems 11 and 12 (only modem 11 is represented in detail in FIG. 2).

A connection between a calling modem and a called modem comprises a training phase followed by a data transmission phase. Consequently, the modem 11 comprises a transmission circuit 13 and a receiving circuit 14, which may operate in the training mode and in the data transmission mode. This is symbolically represented in FIG. 2 by two switching circuits 15 and 16.

The switching circuit 15 forms part of the transmission means 13. In the training phase it connects the input 15a of a transmission circuit 17 to the output 15b of a test signal source 18. In the data transmission phase it connects the input 15a of the transmission circuit 17 to the output 15c of a data source 19. More particularly in the training phase, each of the modems transmits a test signal that is a sinusoid s(t) of known frequency $f_0$, intended for estimating the frequency offset caused by the transmission medium.

The switching circuit 16 forms part of the receiving means 14. In the training phase it connects the output 16a of the sampling means 20 for the received signals to the input 16b of a test circuit 21. In the data transmission phase it connects the output 16a of the sampling means 20 to input 16c of a standard circuit 22 for processing the received signal, which produces output signals 23. The test circuit 21 notably comprises means 9 for estimating the frequency offset $\Delta f$ introduced in the test signal s(t) by the transmission medium, correction means 24 for correcting test signals received during the training phase as a function of the received estimate $\Delta f$, and means 25 for processing corrected test signals. These processing means 25 supply data to the transmission circuit 17 and control signals to the test signal source 18.

In an advantageous embodiment of the invention, the received estimate $\Delta f$ is also transmitted to the signal processing means 22, for example, for initializing standard timing recovery and/or echo canceler algorithms.

In another embodiment of the invention, the test circuit 21 comprises upstream of the evaluation means 9 a receiving filter 26, which enables to do away with echo signals that may be transmitted over the telephone line.

Figure 3:
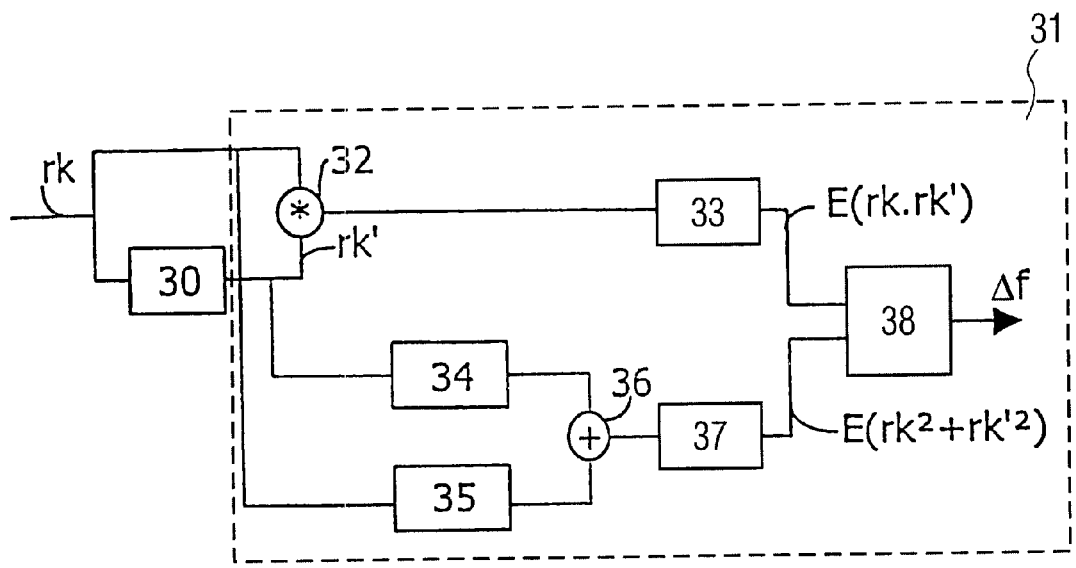
FIG. 3 represents a block diagram of estimation means for estimating the frequency offset according to the invention.

In FIG. 3 are represented in detail the frequency offset estimation means 9. At the instant t=kT, these estimation means 9 receive on the input a sample $r_k$ of the received signal r(t). They notably include phase shifting means 30, which produce a sample $r_k'$ which is out of phase by a multiple of $\pm\Pi/2$ relative to this sample $r_k$, and means 31 for combining the samples $r_k$ and $r_k'$ which provide a trigonometric function of the frequency offset $\Delta f$. The combining means 31 comprise:

means 32 for multiplying the samples $r_k$ and $r_k'$, means 33 for calculating the mean value $E(r_k.r_k')$, means 34 and 35 for calculating the squares $r_k^2$ and $r_k'^2$ of said samples, means 36 for summing said squares, means 37 for calculating the mean value $E(r_k^2+r_k'^2)$ of said sum, and means 38 for calculating a trigonometric function of the frequency offset $\Delta f$ on the basis of the magnitudes $E(r_k+r_k')$ and $E(r_k^2+r_k'^2)$ thus received.

By calculating the product of two samples out of phase by $\Pi/2+p.2\Pi$ (where p is an integer), an expression is obtained that is proportional to the product of the squared amplitude of the received signal and of a sum of two cosines of which one is equal to the sine of a multiple of $\Delta f$. By averaging the obtained expression, this sine term is extracted. In parallel therewith is evaluated the attenuation caused by the transmission medium by calculating the mean value of the sum of the squares of two samples out of phase by $\Pi/2$.

Figure 4:
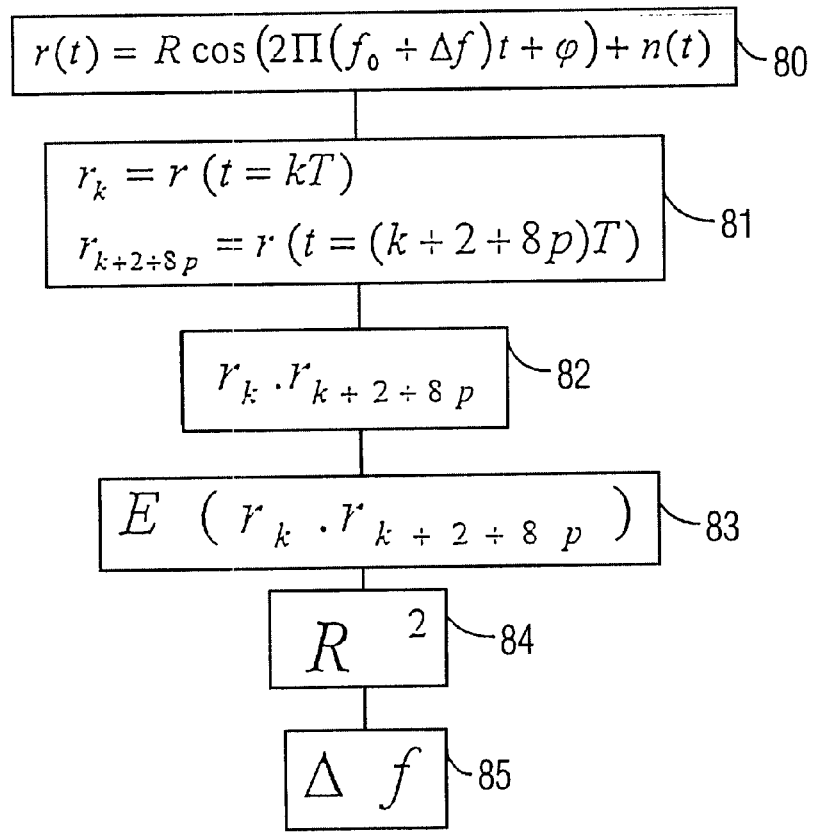
FIG. 4 represents a flow chart of an example of an estimation method of said frequency offset according to the invention.

Now there will be described by way of example and with reference to FIG. 4 an embodiment of the evaluation means 9 for modems in accordance with the standard V34 defined by the CCITT. This standard provides that during the training phase:

the calling modem transmits to the called modem a signal B having frequency $f_0=1200$ Hz (that is, ⅛ of the sampling frequency $f_s=9600$ Hz of the receiver), and the called modem transmits to the calling modem a signal A having frequency $f_0=2400$ Hz (that is, ¼ of the sampling frequency $f_s=9600$ Hz of the receiver). It is these signals A and B that are used as test signals here for evaluating the frequency offset $\Delta f$. In this embodiment, the sampling frequency of the receiver is therefore a multiple of the initial frequency of the test signal. Advantageously, this particularity is taken into account for obtaining samples $r_{k,p}'$ phase shifted by $+\Pi/2+p.2\Pi$ (where p is a natural integer) in a particularly simple manner:

for the signal B, $r_{k,p}'=r_{k+2+8p}$, for the signal A, $r_{k,p}'=r_{k+1+4p}$.

The remote modem receives this signal in step 80 with an attenuation noise, and a frequency offset. The received signal r(t) is written as:

$$r(t)=R\cos(2\Pi(f_0+\Delta f)t+\phi)+n(t)$$

where R is the attenuation caused by the transmission medium, $\Delta f$ is the frequency offset one seeks to evaluate, $\phi$ is a phase and n(t) is white noise.

At step 81, this received signal r(t) is sampled at the frequency $$f_s=\frac{1}{T}=8f_0.$$

The sample r(k) obtained at instant t=kT is thus written in the following fashion:

$r_k = r(t=kT) = R\cos(2\Pi(f_0+\Delta f)kT+\varphi)+n(kT)$ $$r_k = R\cos\left(\frac{2\pi k}{8} + \frac{2\pi k \Delta f}{8f_0} + \varphi\right) + n_k \quad \text{with} \quad n_k = n(kT)$$

$$r_k = R\cos\left(\frac{\pi k}{4} + \frac{\pi k \Delta f}{4f_0} + \varphi\right) + n_k$$

The offset $\Delta f$ will be extracted by multiplying (step K3) two samples $r_k$ and $r_{k+2+8p}$ out of phase by $+\Pi/2+p2\Pi$ where p is a natural integer:

$$r_k r_{k+2+8p} = R^2\cos\left(\frac{\pi k}{4} + \frac{\pi k \Delta f}{4f_0} + \varphi\right)\cos\left(\frac{\pi k}{4} + \frac{\pi k \Delta f}{4f_0} + \frac{\pi}{2} + \frac{(4p+1)\pi\Delta f}{2f_0} + \varphi\right) + n'_k$$

where $n'_k$ is a term of noise.

$$r_k r_{k+2+8p} = \frac{R^2}{2}\left[\cos\left(\frac{\pi k}{2} + \frac{\pi k \Delta f}{2f_0} + 2\varphi + \frac{\pi}{2} + \frac{\pi\Delta f}{2f_0} + \frac{2p\pi\Delta f}{f_0}\right) + \cos\left(\frac{\pi}{2} + \frac{(4p+1)\pi\Delta f}{2f_0}\right)\right] + n'_k$$

$$r_k r_{k+2+8p} = \frac{R^2}{2}\left[\cos\left(\frac{\pi}{2}(k+1) + \frac{\pi\Delta f}{2f_0}(k+1) + 2\left(\varphi + p\frac{\pi\Delta f}{f_0}\right)\right) - \sin\left(\frac{(4p+1)\pi\Delta f}{2f_0}\right)\right] + n'_k$$

$$r_k r_{k+2+8p} = \frac{R^2}{2}\left[\cos\left(\frac{\pi}{2}(k+1)\left(1 + \frac{\Delta f}{f_0}\right) + 2\left(\varphi + p\frac{\pi\Delta f}{f_0}\right)\right) - \sin\left(\frac{(4p+1)\pi\Delta f}{2f_0}\right)\right] + n'_k$$

So three terms are obtained:
1. a continuous component $$-\frac{R^2}{2}\sin\left(\frac{(4p+1)\pi\Delta f}{2f_0}\right).$$

2. a frequency component $$\frac{R^2}{2}\cos\left(\frac{\pi}{2}(k+1)\left(1 + \frac{\Delta f}{f_0}\right) + 2\left(\varphi + p\frac{\pi\Delta f}{f_0}\right)\right).$$

3. a noise.

Only the first term is interesting for the evaluation of $\Delta f$. Therefore, the two other terms are to be done away with. This is achieved by calculating a mean value of $r_k r_{k+2+8p}$, provided that the noise is white noise (step 83). In effect:
- the frequency term $2(f_0+\Delta f)$ is filtered by the low-pass filter that is used for calculating the mean value,
- the expected value of a white noise is zero,
- and, therefore, in the case of white noise, the following equation (1) is obtained:

$$E(r_k r_{k+2+8p}) = -\frac{R^2}{2}\sin\left(\frac{(4p+1)\pi\Delta f}{2f_0}\right) \quad (1)$$

When the received signal is not filtered, the noise is, in effect, white noise whatever the value of p, since the noise $n(t)$ is white noise. Thus, advantageously p=0 is chosen, so that $$\sin\left(\frac{\pi\Delta f}{2f_0}\right) \approx \frac{\pi\Delta f}{2f_0}.$$

One thus avoids to calculate the arcsine trigonometric function to obtain the frequency offset $\Delta f$.

On the other hand, when the test circuit 21 comprises filtering means 26, the noise will only be white noise if the $k^{th}$ and $(k+2+8p)^{th}$ samples are decorrelated. This is obtained by choosing a value for p that is sufficiently large (the value 8p+2 is to be at least equal to the number of coefficients of the transfer function of the filter).

There remains to be estimated the term $R^2$ which is not known (step 84). For this purpose, for example the following method is used:

$$r_k = R\cos\left(\frac{\pi k}{4} + \frac{\pi k \Delta f}{4f_0} + \varphi\right) + n_k$$

and $r_{k+2+8p} = R\cos\left(\Phi_k + \frac{\pi}{2} + (8p+1)\frac{\pi\Delta f}{2f_0}\right) + n_{k+2+8p}$ with $\Phi_k = \frac{\pi k}{4} + \frac{\pi k \Delta f}{4f_0} + \varphi$ If it is considered that $\Delta f_{max} \leq 12$ Hz, and p=0, the maximum phase $\Theta$ introduced by $\Delta f$ is negligible:

$$\Theta_{max} = \frac{\pi\Delta f_{max}}{2f_0} = 0.9° \cdot \Sigma$$

There may thus be written that $$r_{k+2} \approx R\cos\left(\Phi_k + \frac{\pi}{2}\right) + n_{k+2} = R\sin(\Phi_k) + n_{k+2}$$

For extracting $R^2$ there is calculated $r_k^2 + r_{k+2}^2$:

$$r_k^2 + r_{k+2}^2 = R^2(\cos^2(\Phi_k) + \sin^2(\Phi_k)) + n'_k$$

with $n'_k = 2R\cos(\Phi_k)n_k + n^2_k + 2R\sin(\Phi_k)n_{k+2} + n^2_{k+2}$
Consequently, $r_k^2 + r_{k+2}^2 = R^2 + n'_k$
and $E(r_k^2 + r_{k+2}^2) = R^2 + E(n'_k)$
$E(n'_k) = E(2R\cos(\Phi_k)n_k + n^2_k + 2R\sin(\Phi_k)n_{k+2} + n^2_{k+2}) = 2\sigma^2$
where $\sigma$ is the variance of the noise.

$E(r_k^2 + r_{k+2}^2) = R^2 + 2\sigma^2$ with $\sigma^2 << R^2$

By neglecting the term $\sigma_2$ before the term $R^2$, the estimate (2) is obtained:

$$E(r_k^2 + r_{k+2}^2) \approx R^2 \quad (2)$$

By replacing in the equation (1) $R^2$ by its estimate (2), there is obtained:

$$E(r_k r_{k+2+8p}) = -\frac{E(r_k^2 + r_{k+2}^2)}{2}\sin\left(\frac{(4p+1)\pi\Delta f}{2f_0}\right)$$

that is to say: sin $$\sin\left(\frac{(4p+1)\pi\Delta f}{2f_0}\right) = -\frac{2E(r_k r_{k+2+8p})}{E(r_k^2 + r_{k+2}^2)}$$

To avoid any ambiguity, a choice is thus to be made:

$$-\frac{\pi}{2} \leq \frac{(4p+1)\pi\Delta f}{2f_0} \leq \frac{\pi}{2},$$

which gives an additional condition to be fulfilled when the choice of the value of the natural integer p is made.

One thus obtains (step 85) the estimate $\hat{\Delta}f_{1200}$ of the phase offset $\Delta f$ for for $f_0 = 1200$ Hz:

$$\hat{\Delta}f_{1200} = \frac{2f_0}{(4p+1)\pi}\sin^{-1}\left(-\frac{2E(r_k r_{k+2+8p})}{E(r_k^2 + r_{k+2}^2)}\right)$$

The same calculations can be applied to obtain the estimate $\hat{\Delta}f_{2400}$ of the phase offset $\Delta f$ for $f_0 = 2400$ Hz:

$$\hat{\Delta}f_{2400} = \frac{2f_0}{(4p+1)\pi}\sin^{-1}\left(-\frac{2E(r_k r_{k+1+4p})}{E(r_k^2 + r_{k+1}^2)}\right).$$

Figure 5:
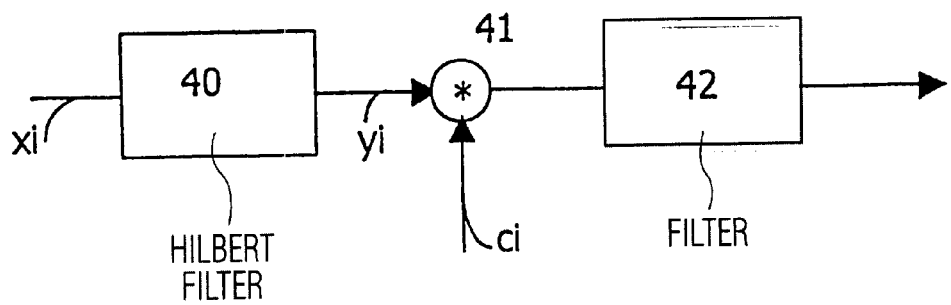
FIG. 5 represents a block diagram of an example of a test signal correction circuit according to the invention.

In FIG. 5 is represented in detail an example of embodiment of the correction means 24 of the test signals x(t) received during the process of the training phase. They comprise a Hilbert filter 40 for converting each real sample $x_i$ of the received signal x(t) into a complex sample $y_i$, a multiplier 41 for multiplying this complex sample by a correction sample $c_i = e^{j\Theta_i}$ with $\Theta_i = -2\Pi\hat{\Delta}f \cdot iT$, and filter means 42 for tapping the real portion from the corrected signal. This real portion is transmitted to the test signal processing means 25.

Figure 6:
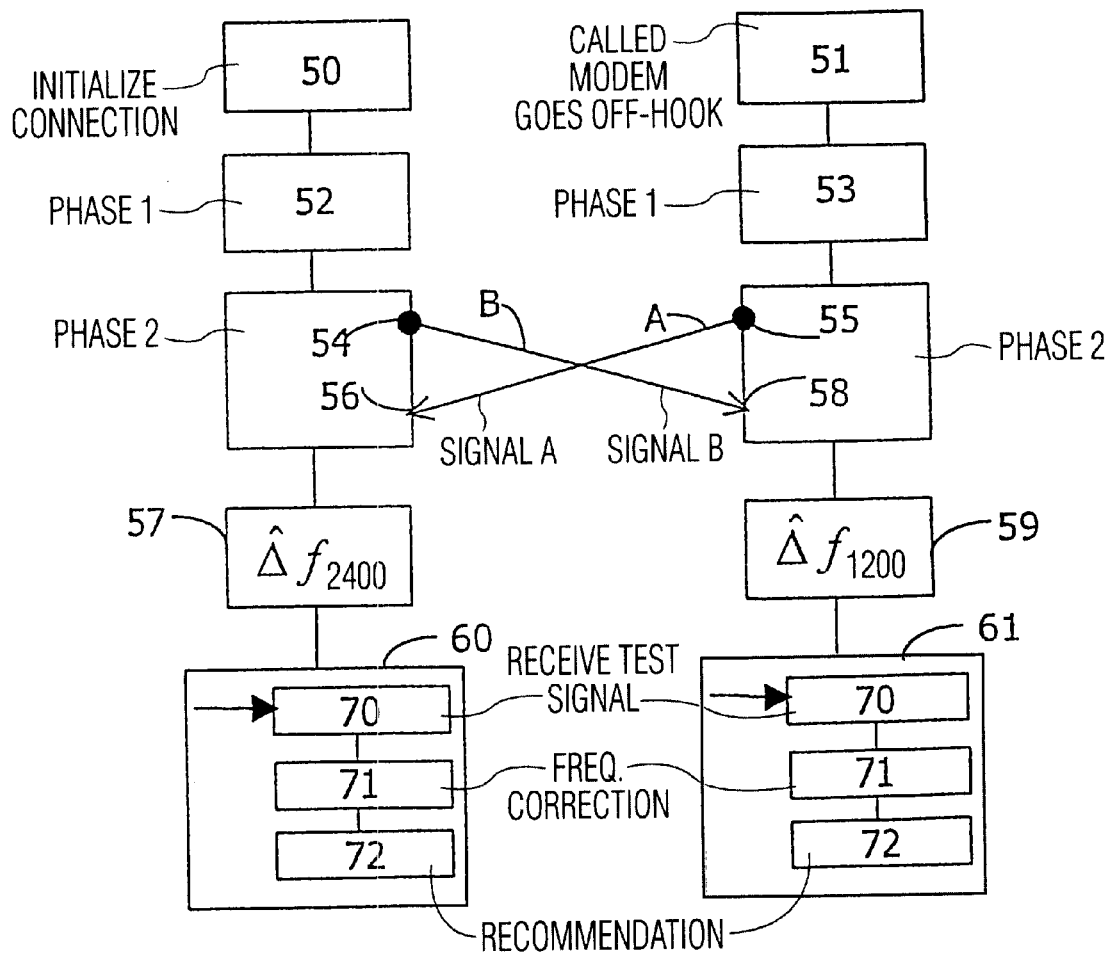
FIG. 6 represents a flow chart of an example of a test method according to the invention.

In FIG. 6 is shown in the form of a diagram an example of a test method, in the case of a transmission system as described in FIG. 2 between two modems that are in conformity with Recommendation V34 of the CCITT. Recommendation V34 provides a training phase between a calling modem, and a called modem prior to a data transmission phase. The object of this training phase is notably to choose a certain number of parameters for the transmission as a function of characteristics of the transmission medium used. It is subdivided into four phases called phase 1, 2, 3 and 4 in Recommendation V34. The operations carried out during these various phases do not form the object of the invention and are therefore not described here. For more details reference may be made to aforesaid Recommendation.

In step 50 the calling modem initializes a connection with the called modem. In step 51 the called modem goes off-hook. Then, in steps 52 and 53 respectively, the called and calling modems carry out the operations provided in phase 1. In step 54, the calling modem arrives at phase 2 and sends the signal B having frequency $f_0 = 1200$ Hz to the called modem. In parallel, in step 55 the called modem arrives at phase 2 by sending the signal A having frequency $f_0 = 2400$ Hz to the calling modem. In step 56, the calling modem receives the signal A and in step 57 it calculates the frequency offset estimate $\hat{\Delta}f_{2400}$ by applying the method described above with reference to FIG. 4. In parallel, in step 58 the called modem receives the signal B and in step 59 it calculates the frequency offset $\hat{\Delta}f_{1200}$ by applying the method described above with reference to FIG. 4. In steps 60 and 61 respectively, the calling and called modems carry on with their operations planned in the phases 2, 3 and 4. Each time a test signal x(t) is received during one of these phases (event 70 in FIG. 6), the modem concerned carries out the frequency correction of this signal (operation 71) before effecting the processing designed by the Recommendation (operation 72). The operation 71 comprises the following steps:

step 71a: calculation of the complex coefficients $y_i$ based on real samples $x_i$ of the received signal x(t), step 71b: multiplication of each coefficient $y_i$ by a correction sample $c_i$, step 71c: taking away the real portion of the obtained complex samples corrected in this manner.

The invention is not restricted to the embodiments that have just been described by way of example. It can be applied to any transmission system that utilizes one or various carriers and which enables to transmit a pure sinusoidal signal at a given instant.

What is claimed is:

1. A transmission system between at least a transmitter and at least a receiver via a transmission medium likely to cause a frequency offset and an attenuation, said transmitter comprising emitting means for emitting a sinusoidal signal of known frequency, and said receiver comprising receiving means for receiving said sinusoidal signal and estimation means for estimating said frequency offset from said received sinusoidal signal, characterized in that said estimation means comprise sampling means for sampling said received sinusoidal signal, phase shifting means for producing $\Pi/2+p.2\Pi$ phase shifted samples of said received sinusoidal signal, where p is an integer, first calculation means for calculating said attenuation from at least two of said phase shifted samples, and second calculation means for calculating said frequency offset from at least two of said phase shifted samples and from the calculated attenuation.

2. A transmission system as claimed in claim 1, characterized in that first calculation means comprise means for calculating a mean value of an addition of the square value of two $\Pi/2$ phase shifted samples.

3. A transmission system as claimed in claim 1, characterized in that said receiver comprises a reception filter and second calculation means use two $\Pi/2+p.2\Pi$ phase shifted samples where p is chosen so that said two samples are decorrelated.

4. A transmission system as claimed in claim 1, characterized in that said second calculation means comprise means for calculating a mean value of a product of said samples so as to provide a trigonometric function of said offset.

5. A receiver notably intended to receive a sinusoidal signal of known frequency transmitted via a transmission medium likely to introduce a frequency offset and an attenuation, and comprising estimation means for estimating said frequency offset from said received sinusoidal signal, characterized in that said estimation means comprise sampling means for sampling said received sinusoidal signal, phase shifting means for producing $\Pi/2+p.2\Pi$ phase shifted samples of said received sinusoidal signal, where p is an integer, first calculation means for calculating said attenuation from at least two of said phase shifted samples, and second calculation means for calculating said frequency offset from at least two of said phase shifted samples and from the calculated attenuation.

6. A method of estimating the frequency offset caused on a carrier by a transmission medium, comprising a transmission step of a sinusoidal signal of known frequency, characterized in that while said medium is likely to cause an attenuation, said method comprises at the receiving end a sampling step and a phase shifting step for producing $\Pi/2+p.2\Pi$ phase shifted samples of said received sinusoidal signal, where p is an integer, a first calculation step for calculating said attenuation from at least two of said phase shifted samples, and a second calculation step for calculating said frequency offset from at least two said phase shifted samples and from the calculated attenuation.

7. A computer program intended to implement the method of estimating the frequency offset caused on a carrier by a transmission medium as claimed in claim 6.

* * * * *